US010711962B2

(12) United States Patent
Tannahill et al.

(10) Patent No.: US 10,711,962 B2
(45) Date of Patent: Jul. 14, 2020

(54) SPIRAL WRAP POWER AND LIGHTING SYSTEM

(71) Applicant: Angler's-Friend, LLC, Merriam, KS (US)

(72) Inventors: Corben D. Tannahill, Merriam, KS (US); David B. Tannahill, Merriam, KS (US)

(73) Assignee: ANGLERS-FRIEND, LLC, Merriam, KS (US)

( * ) Notice: Subject to any disclaimer, the term of this patent is extended or adjusted under 35 U.S.C. 154(b) by 0 days.

(21) Appl. No.: 16/436,497

(22) Filed: Jun. 10, 2019

(65) Prior Publication Data

US 2019/0293248 A1    Sep. 26, 2019

Related U.S. Application Data

(63) Continuation-in-part of application No. 14/859,269, filed on Sep. 19, 2015, now Pat. No. 10,317,022.

(60) Provisional application No. 62/054,718, filed on Sep. 24, 2014, provisional application No. 62/062,252, filed on Oct. 10, 2014.

(51) Int. Cl.
| | |
|---|---|
| *F21S 9/03* | (2006.01) |
| *F21S 4/26* | (2016.01) |
| *F21V 23/00* | (2015.01) |
| *F21V 21/32* | (2006.01) |
| *F21Y 107/70* | (2016.01) |
| *F21Y 115/10* | (2016.08) |

(52) U.S. Cl.
CPC ............... *F21S 9/035* (2013.01); *F21S 4/26* (2016.01); *F21V 21/32* (2013.01); *F21V 23/002* (2013.01); *F21Y 2107/70* (2016.08); *F21Y 2115/10* (2016.08)

(58) Field of Classification Search
None
See application file for complete search history.

(56) References Cited

U.S. PATENT DOCUMENTS

| | | | |
|---|---|---|---|
| 6,371,637 | B1 | 4/2002 | Atchinson et al. |
| 6,580,228 | B1 | 6/2003 | Chen et al. |
| 2002/0071276 | A1 | 6/2002 | Blum |
| 2004/0037079 | A1 | 2/2004 | Luk |
| 2005/0162850 | A1 | 7/2005 | Luk et al. |
| 2006/0158878 | A1 | 7/2006 | Howell |
| 2011/0267812 | A1 | 11/2011 | Van De Ven et al. |
| 2013/0107514 | A1 | 5/2013 | McNabb et al. |

(Continued)

*Primary Examiner* — Elmito Breval
(74) *Attorney, Agent, or Firm* — Husch Blackwell LLP

(57) ABSTRACT

A spiral wrap power and lighting system may include spiral cut flexible tubular sleeve, a plurality of photovoltaic cells, and a series of light emitting devices. The sleeve can have structure sufficient for being adapted to and maintained in a desired shape. The sleeve is also capable of being coiled around an object. The photovoltaic cells may be in a panel configuration and can be arranged in a generally helical configuration defining at least one revolution. The photovoltaic cells may also be arranged in a V-shaped configuration. The light emitting devices can comprise a plurality of axially and spirally spaced lighting sources affixed to a flexible strip, which is in turn affixed to the sleeve. The power and lighting system can have structure sufficient for being maintained in a desired flexible tubular shape on its own accord.

17 Claims, 5 Drawing Sheets

(56) References Cited

U.S. PATENT DOCUMENTS

2014/0111982 A1      4/2014   Kuenzler
2014/0268740 A1      9/2014   Veres et al.
2014/0331532 A1     11/2014   Deppiesse
2015/0285472 A1*   10/2015   Evitt .................... F21V 17/007
                                                                    362/224

\* cited by examiner

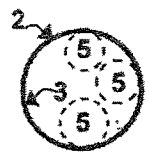
FIG. 1
FIG. 3
FIG. 4
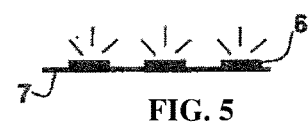
FIG. 5
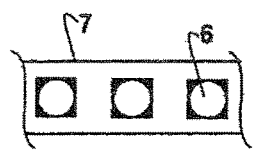
FIG. 6
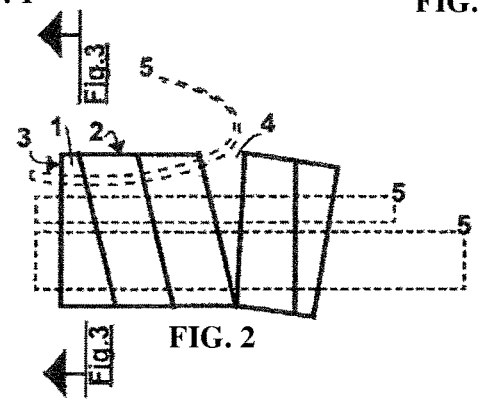
FIG. 2
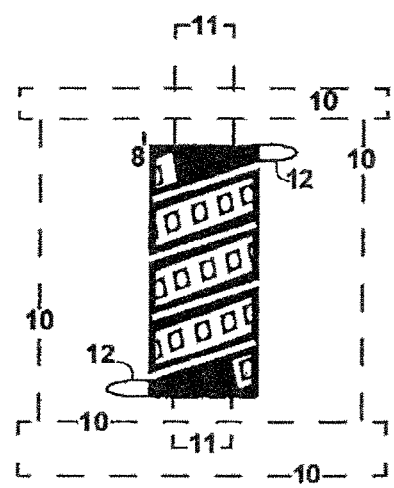
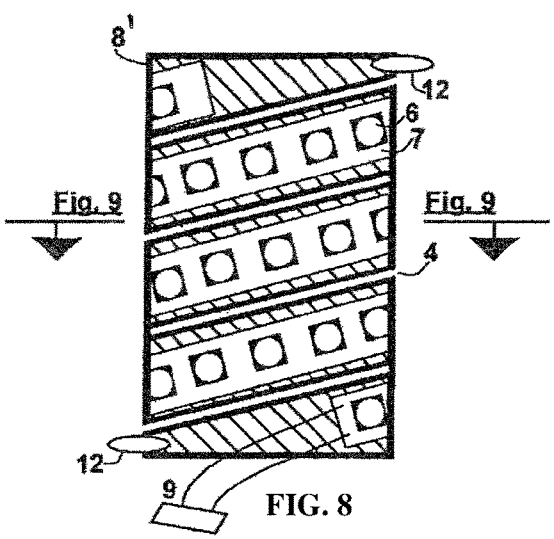
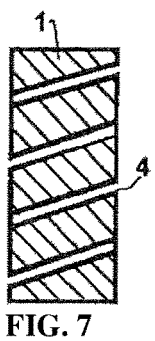
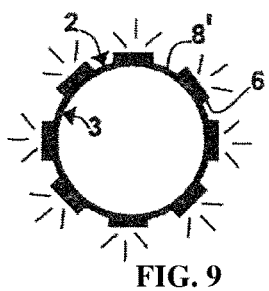
FIG. 11
FIG. 8
FIG. 7
FIG. 9
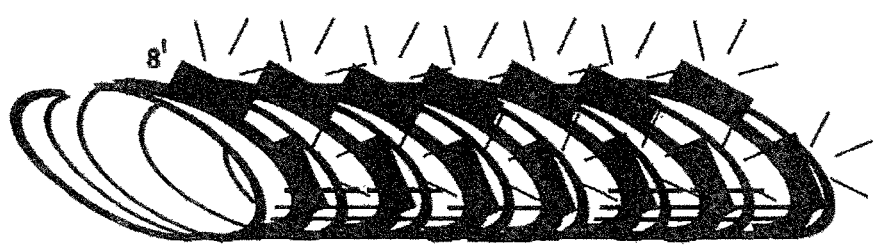
FIG. 10

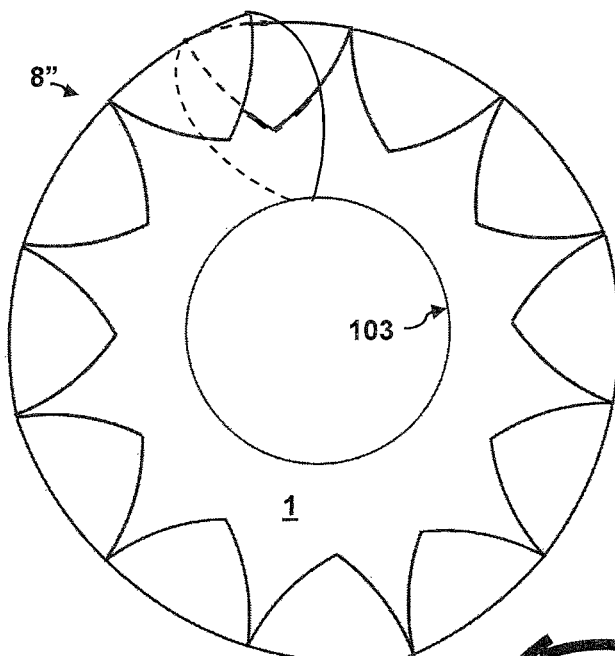
FIG. 12
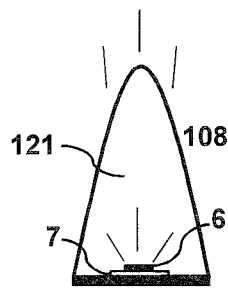
FIG. 13
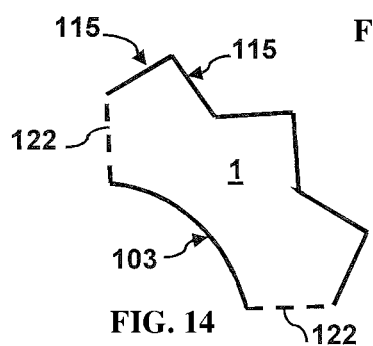
FIG. 14
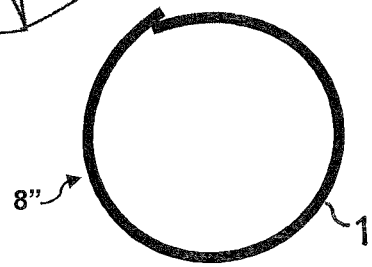
FIG. 15
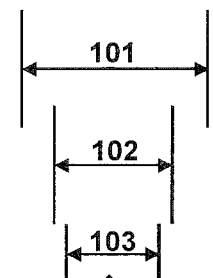
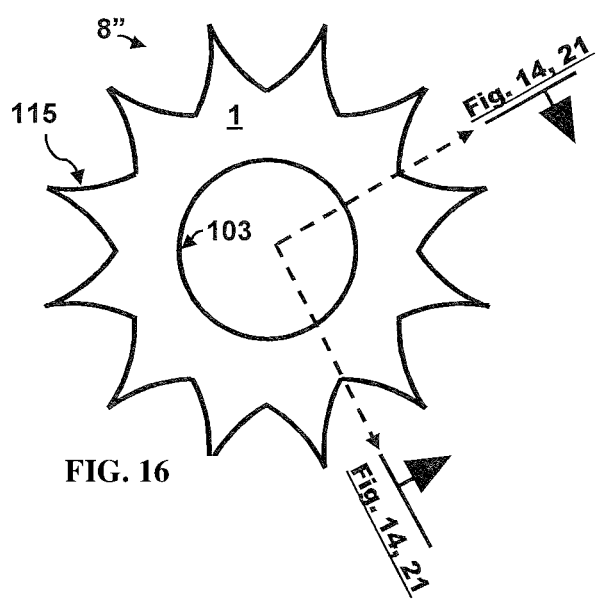
FIG. 16
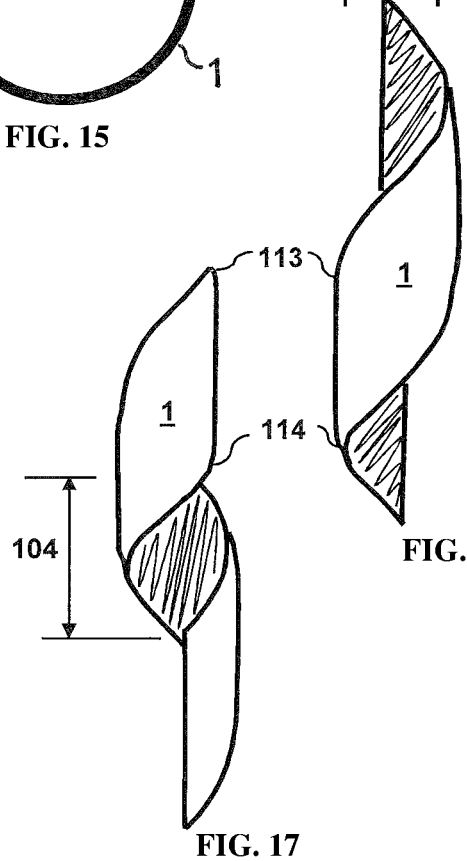
FIG. 17
FIG. 18

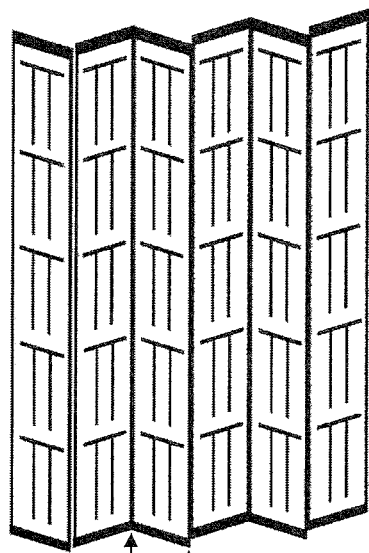
FIG. 20
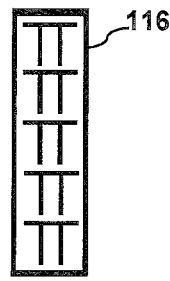
FIG. 19
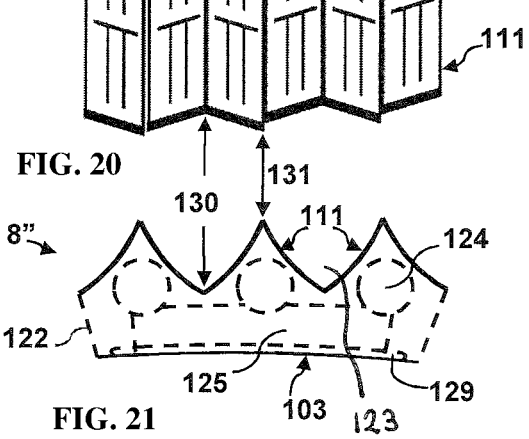
FIG. 21
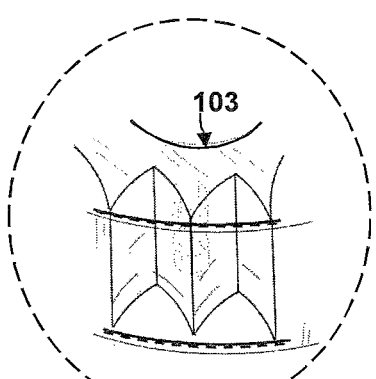
FIG. 22B
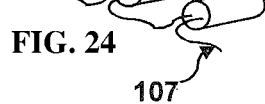
FIB. 23
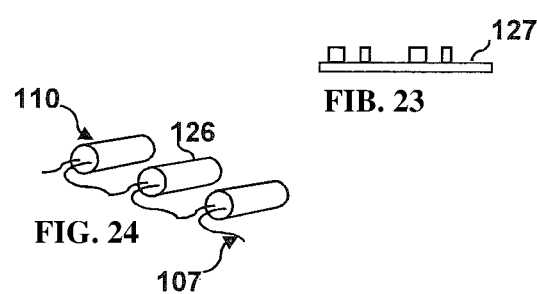
FIG. 24
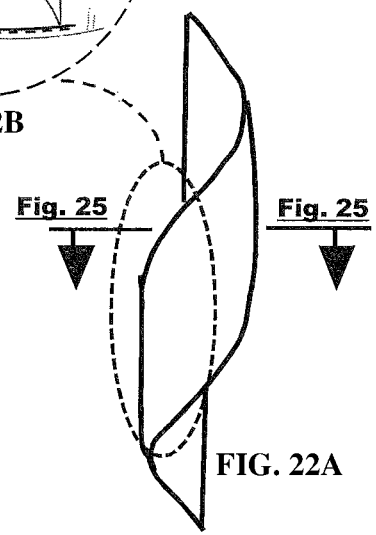
FIG. 22A
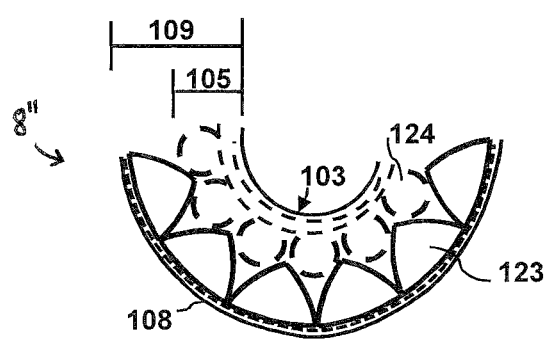
FIG. 25

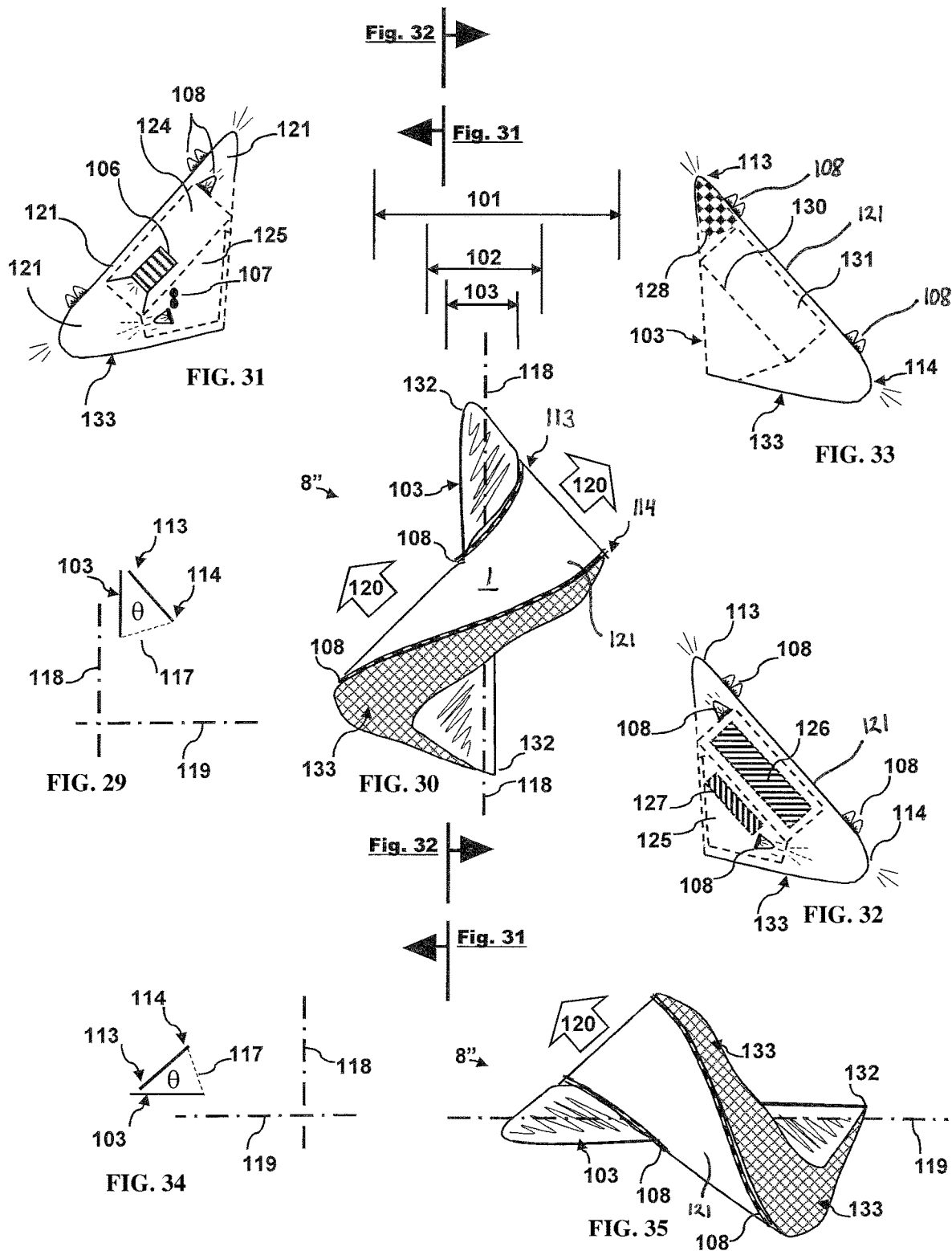

SPIRAL WRAP POWER AND LIGHTING SYSTEM

CROSS-REFERENCE TO RELATED APPLICATIONS

This Application is a Continuation-in-Part of and claims priority to U.S. patent application Ser. No. 14/859,269, filed on Sep. 19, 2015, to Corben D. Tannahill and David B. Tannahill entitled "Spiral Wrap Lighting System," currently pending, which claims priority to U.S. Provisional Patent Application Ser. No. 62/054,718, filed on Sep. 24, 2014, to Corben D. Tannahill and David B. Tannahill, entitled "Spiral Wrap LED Lighting System," and U.S. Provisional Patent Application Ser. No. 62/062,252, filed on Oct. 20, 2014, to Corben D. Tannahill and David B. Tannahill, entitled "Spiral Wrap LED Lighting System." The entire disclosures, including the specifications and drawings, of all the above-referenced applications are incorporated herein by reference.

BACKGROUND OF THE INVENTION

Traditional lighting systems, including luminaires, such as lights, lighting fixtures, or lighting systems that generally comprise a fixture body or housing and at least one lamp, fixed position architectural lighting, movable portable architectural lighting; flashlights, and the like, have historically relied on one or more lamps, which are commonly referred to as "bulbs," for emitting and distributing light. Such traditional lighting systems can be classified as either rigid or flexible.

Traditional rigid lighting systems typically rely on one more fixed-position bulbs for emitting and distributing light. The bulbs of traditionally known rigid lighting systems typically interface with a lighting fixture socket and may include, for example, standard screw-in bulbs, recessed single contact bulbs, recessed double contact bulbs, and bi-pin bulbs, among others. These traditional rigid lighting systems are typically either powered by batteries formed into correspondingly rigid battery packs or plugged into a power source, such as an electrical receptacle, or "hard-wired" into an electrical outlet. Further, the bulbs of known rigid lighting systems may include a host of light emitting diodes ("LEDs"), which may additionally be hardwired, plugged into, or otherwise connected to an energy source. The shape and orientation of a rigid lighting system or luminaire can limit the distribution of light coming therefrom and the efficacy of the lighting system, and traditional rigid lighting systems are generally incapable of attachment to other devices without additional attachment devices, such as hardware and the like.

Known flexible lighting systems, such as gooseneck lights, also rely on one or more bulbs for emitting and distributing light, and may further utilize a flexible metal conduit between a fixture base and a fixture lamp socket that defines individual opposing geometric-shaped endpoints. The end points are located between a configurable gooseneck conduit that provides directional orientation for an endpoint lamp socket and a bulb. However, traditional flexible lighting systems may also be generally incapable of attachment to other devices without additional attachment, devices such as hardware and the like. Such flexible lighting systems also lack the degree of structure sufficient for being adapted to and maintained in a desired shape. Additionally, known flexible lighting systems, such as rope lights and decorative lighting strings, are not always well-suited for being wrapped or coiled around an object and are typically incapable of maintaining a desired shape without additional attachment devices, hardware, and the like. Known flexible lighting systems, when wrapped or otherwise coiled around an object, further lack capacity for an object to enter or exit an interior dimension of known flexible lighting system.

While some existing lighting systems have combined bulbs with power systems or energy harvesting device, including photovoltaic cells, in combination with batteries, such lighting systems lack the degree of portability and flexibility desired for many applications.

Accordingly, a need exists for a lighting system, power generation system, and power storage system that may be adapted for wrapping around various objects, and may be maintained in a desired shape on its own accord.

SUMMARY OF THE INVENTION

One embodiment of the present invention is directed to a spiral wrap lighting system and power system with at least one electromagnetic energy emitting device in electrical communication with an energy source. The system according to one embodiment may generally comprise one or more light-emitting devices, one or more energy harvesting devices, such as photovoltaic cells or a photovoltaic panel configuration, one or more energy storage devices, an electrical control device, and/or an electrically powered device. The lighting and power system of the present invention may further comprise a flexible generally cylindrical tubular sleeve that may be formed from a coiled strip of material having sufficient structure for being adapted to and maintained in a desired shape. The sleeve may have a spiraling, tubular-shaped configuration and comprise one or more revolutions. The sleeve may be constructed of a spiral cut tube. As such, the sleeve may comprise a length of tubing having a spiral cut defined therethrough from a first end to a second end of the tubing and rotating around its circumference. Further, in another embodiment, the sleeve may include an opening defined between two adjacent revolutions of the coiled strip of material, wherein such opening is created by a spiral cut defined in the sleeve. The opening may permit objects, cabling, wires, or the like to enter or exit an interior of the sleeve. A plurality of light-emitting devices may be affixed to a flexible strip, which in turn can be affixed to the sleeve. The light-emitting devices may be capable of emitting electromagnetic waves within the ultraviolet, visible light, and infrared spectrums, for example. In one embodiment, the light-emitting devices are light-emitting diodes ("LEDs"). An electrical conductor connecting the light-emitting devices to the energy source may be flexible as well.

The flexible lighting and power system of the present invention may have structure sufficient for being adapted to and maintained in a desired shape on its own accord. Further, the sleeve incorporated into the lighting and power system may be capable of being wrapped or coiled around an object, including, for example, a pipe, tube, pole, wire, rope, buoy, lamp rod, a lighting fixture, an architectural component, an automotive part, a sporting good, a fishing light, furniture, a tree, or other suitable objects. The system may further comprise a support point or support region that is adapted to support the light-emitting devices in a generally perpendicular orientation relative to a horizontal surface, among other orientations.

The flexible lighting and power system may additionally comprise one or more electrical control components, such as an electrical relay, an electrical switch, or an electrical control circuit board, coupled with an electrical conductor and configured to selectively control light emitted from the light emitting devices. The one or more electrical control components can be capable of controlling the emission relative to at least one portion of the lighting system, such as a quarter section, half section, or a full section of the perimeter, circumference or length of the lighting system.

The system of the present invention may further comprise an electrical storage device, such as a battery, in electrical communication with the energy source, such as the one or more photovoltaic cells. In one embodiment, the electrical storage device may comprise a lithium-ion battery and reside in a void or other space configured for receiving the electrical storage device. It will be appreciated that the photovoltaic cells may be arranged in a photovoltaic panel configuration or in a V-shaped combination. Further, the V-shaped combination can be arranged in a generally circular fashion.

In a further embodiment, the system of the present invention may comprise an electrically conductive port that is adapted for charging an electrical storage device or powering another electrical device coupled with an electrical conductor. As such, the electrically conductive port may be adapted for energizing the lighting system and power device, or for energizing a separate electrically-powered device.

In another embodiment, the system of the present invention may comprise a plurality of batteries arranged in a generally helical configuration that is coupled with an at least one electrical conductor that is adapted for connection with at least one of a light emitting device, a photovoltaic cell, an electrical control device, and an electrically powered device.

BRIEF DESCRIPTION OF THE DRAWINGS

The accompanying drawings form a part of the specification and are to be read in conjunction therewith, in which like reference numerals are employed to indicate like or similar parts in the various views, and wherein:

FIG. 1 is a side perspective view of a spiral wrap tubular sleeve in accordance with one embodiment of the present invention;

FIG. 2 is a side view of a spiral wrap tubular sleeve illustrating cables or wires disposed within an interior and further illustrating cables or wires entering or exiting a separation or opening defined between two spirals in accordance with one embodiment of the present invention;

FIG. 3 is a schematic end view of a spiral wrap tubular sleeve showing cabling or wiring disposed within an interior space of the spiral wrap tubular sleeve in accordance with one embodiment of the present invention;

FIG. 4 is a top plan view of a singular LED;

FIG. 5 is a side view of an LED strip including multiple LEDs;

FIG. 6 is a top plan view of an LED strip including multiple LEDs;

FIG. 7 is a side view of a spiral wrap tubular sleeve in accordance with one embodiment of the present invention;

FIG. 8 is a side view of a spiral wrap tubular sleeve having a flexible LED strip attached to an exterior surface thereof so as to form a spiral wrap LED lighting system in accordance with one embodiment of the present invention;

FIG. 9 is an end view of a spiral wrap LED lighting system in accordance with one embodiment of the present invention;

FIG. 10 is a side perspective view of a spiral wrap LED lighting system in accordance with one embodiment of the present invention;

FIG. 11 is a side view of a spiral wrap LED lighting system integrated with a generic lamp fixture in accordance with one embodiment of the present invention;

FIG. 12 is a schematic top plan view of the power and lighting system in accordance with one embodiment of the present invention;

FIG. 13 is a schematic side view of a LED strip generally contained in a flexible protective coating in accordance with one embodiment of the present invention;

FIG. 14 is a schematic top plan view of a portion of the power and lighting system in accordance with one embodiment of the present invention;

FIG. 15 is a schematic top plan view of the power and lighting system in accordance with one embodiment of the present invention;

FIG. 16 is a schematic top plan view of the power and lighting system in accordance with one embodiment of the present invention;

FIG. 17 is a partial side view of the power and lighting system in accordance with one embodiment of the present invention;

FIG. 18 is a side view of the power and lighting system in FIG. 17;

FIG. 19 is a side view of a photovoltaic cell in accordance with one embodiment of the present invention;

FIG. 20 is a side view of a photovoltaic panel configuration comprising a plurality of photovoltaic cells in accordance with one embodiment of the present invention;

FIG. 21 is a schematic top view of a portion of the power and lighting system of FIG. 16;

FIG. 22A is a partial side view of the power and lighting system in accordance with one embodiment of the present invention;

FIG. 22B is a perspective detail view of a portion of the power and lighting system of FIG. 22A;

FIG. 23 is a side plan view of an electrical control circuit board in accordance with one embodiment of the present invention;

FIG. 24 is a perspective of a plurality of electrical storage devices arranged in series in accordance with one embodiment of the present invention;

FIG. 25 is a schematic top view of a portion of the photovoltaic panel configuration of FIG. 22A;

FIG. 29 is a schematic representation of the power and lighting system in a vertical orientation in accordance with one embodiment of the present invention;

FIG. 30 is a side view of the power and lighting system in a vertical orientation in accordance with one embodiment of the present invention;

FIG. 31 is a schematic side view of a portion of the power and lighting system of FIG. 30;

FIG. 32 is a schematic side view of a portion of the power and lighting system of FIG. 30;

FIG. 33 is a schematic side view of a portion of the power and lighting system in accordance with one embodiment of the present invention;

FIG. 34 is a schematic representation of the power and lighting system in a horizontal orientation in accordance with one embodiment of the present invention; and FIG. 35 is a side view of the power and lighting system in a horizontal orientation in accordance with one embodiment of the present invention.

DETAILED DESCRIPTION OF THE INVENTION

Figure 26:
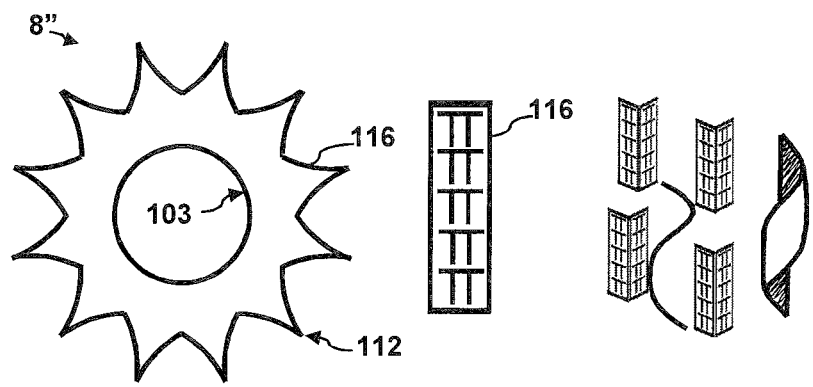
FIG. 26 is a schematic representation the power and lighting system in accordance with one embodiment of the present invention.

Various embodiments of the present invention are described and shown in the accompanying figures and drawings. For purposes of clarity in illustrating the characteristics of the present invention, proportional relationships of the elements have not necessarily been maintained in the figures and drawings. It will be understood that any dimensions included in the figures and drawings are simply provided as examples and dimensions other than those provided therein are also within the scope of the invention.

The following detailed description of the invention references specific embodiments in which the invention can be practiced. The embodiments are intended to describe aspects of the invention in sufficient detail to enable those skilled in the art to practice the invention. Other embodiments can be utilized and changes can be made without departing from the scope of the present invention. The present invention is defined by the appended claims and the description is, therefore, not to be taken in a limiting sense and shall not limit the scope of equivalents to which such claims are entitled.

Generally, the present invention is directed to a flexible lighting system 8 that has structure sufficient for being adapted to and maintained in a desired shape on its own accord. Further, the system can have a flexible cylindrical tubular spiral sleeve 1 capable of being wrapped or coiled around an object. The spiral wrap tubing sleeve 1 may be formed in many ways, including from a spiral cut tube. In one embodiment, the spiral wrap tubing sleeve 1 can be formed from a tube with a torsion cut or spiral cut defined therethrough from a first end to a second end of the tubing and rotating around its circumference. The spiral wrap tubing sleeve 1 may be generally configured into an overall shape of any combination of linear or curvilinear shapes being capable of spanning within, from, between, or wrapping around other objects. It will be appreciated that the general overall shape of a spiral wrap tubing sleeve 1 may allow for various components of the lighting system 8, including, without limitation, a LED flexible strip 7; at least one electromagnetic energy emitting device 106; at least one energy harvesting device, which may include a photovoltaic cell 116; and/or at least one energy storage device which may include a battery, to be affixed to or coupled with a spiral wrap tubing sleeve 1 for purposes of achieving the desired purpose of the lighting system 8.

The spiral wrap tubing sleeve 1 of the system 8 can be formed in similar manner as a spiral protective sleeve, which is commonly used as an electrical conduit, including a spiral proactive sleeve produced from plastics, including, without limitation, polyethylene ("PE"), acrylonitrile butadiene styrene ("ABS"), nylon, or the like. The spiral wrap tubing sleeve 1 may comprise an opening 4, wherein the opening 4 may be defined between two adjacent revolutions of a coiled strip of material. However, the opening 4 may be formed in a variety of other manners, including by a torsion cut, spiral cut, or other aperture defined within the spiral wrap tubing sleeve 1. The spiral wrap tubing sleeve 1 can be used for containing within its interior 3 wires and cabling 5 and permitting such wires or cabling 5 from within an interior 3 to exit at any point along the openings 4 created by the spiral shape so as to move from the interior 3 to the exterior 2 of the spiral wrap tubing sleeve 1, as best illustrated in FIGS. 2 and 3. The lighting system 8 may comprise structural elements or components that permit the lighting system 8 to be flexible and maintain a desired shape. For example, such structural elements or components may be in addition to, or in alternative to, materials such as plastics, rubbers, textiles, cellulosic materials, polymers, and the like. Further, the lighting system 8 may optionally comprise structural elements or components that permit the spiral wrap tubing sleeve 1 to provide structural support, to be flexible, and to maintain a desired shape. Such structural elements or components may include, without limitation, wires, stiffening members, metallic strips, molded urethane, or other materials having structural properties that allow them to be flexible and maintain a desired shape. In some embodiments, these structural elements may be located, for example, within the inner core of the spiral wrap tubing sleeve 1 (i.e., integrated at least partially or wholly within the material forming the sleeve tubing 1) or may be located within the interior 3 and/or the exterior 2 of the spiral wrap tubing sleeve 1. The desired shape of the spiral wrap tubing sleeve 1 may be the shape that is achieved when the lighting system 8 is applied to, wrapped around, or coiled around an object such as a pipe, tube, pole, wire, rope, buoy, lamp rod 11, a lighting fixture or bracket, architectural components, automotive parts, sporting goods, fishing lights, furniture, trees, and a host of other objects. The lighting system 8 of the present invention may also be coiled or otherwise wrapped or placed around another object's shape so as to be configured into a particular shape or pattern. It will be appreciated that the foregoing objects and illustrations are simply provided as non-limiting examples, and that the system 8 may be applied to a large number of other objects.

One embodiment of the present invention is directed to a flexible spiral wrap LED lighting system 8', as best illustrated in FIGS. 8-11, that includes a series of light-emitting devices such as LEDs 6, which are best illustrated in FIGS. 4-6 and 9. As best illustrated in FIG. 31, another embodiment of the present invention is directed to a flexible spiral wrap power and lighting system 8" with at least one electromagnetic energy emitting device 106 that is in electrical communication with an energy source via an electrical conductor 107, wherein the energy source can include one or more electrically conductive ports; one or more electrical energy storage devices; and/or one or more energy harvesting or capturing devices, such as photovoltaic cells 116, a photovoltaic panel configuration 111, 112, or array, module, or other configuration of photovoltaic cells arranged in series or parallel.

According to a first embodiment of the present invention, the spiral wrap LED lighting system 8', as best illustrated in FIGS. 8-11, can comprise a series of LEDs 6 in the form of an LED flexible strip 7. Embodiments of the present invention may combine an adhesive-backed flexible LED strip 7, and a spiral wrap tubing cylindrical sleeve 1 that can be arranged in a generally cylindrically axial alignment. A flexible LED strip 7 can be affixed or otherwise attached to a surface of a spiral wrap tubing sleeve 1, as shown in FIGS. 8-11. By affixing LED strips 7 to the exterior surface 2 of the spiral wrap tubing sleeve 1, these two component parts may be combined into an optimally cost-effective and easily produced embodiment of the lighting system 8'. Such an embodiment of the present invention being a novel lighting solution which resolves unmet needs for the lighting industry and can eliminate the need for some traditional lighting hardware such as a lamp socket and traditional bulb, while providing multi-directional lighting, as best illustrated in FIG. 9, flexible physical shape, and sufficient structure to maintain a desired shape.

The spiral wrap lighting system 8' may include structural elements or components, such as wires, stiffening members, metallic strips, or other materials, that permit the lighting system 8' to be flexible and maintain a desired shape, which, as discussed above, may include materials that are in addition to or in alternative to materials such as plastics, rubbers, textiles, cellulosic materials, polymers, and the like, and any combination thereof. It will be appreciated that the spiral wrap tubing sleeve 1 and strip 7 may be integrally formed during a manufacturing process. In one embodiment, the spiral wrap tubing sleeve 1 and strip 7 may be co-extruded, extruded together in a single die, homogeneously formed, and/or otherwise combined. As depicted in FIGS. 8 and 11, simple, generic, mechanical fasteners 12, such as hook and loop patches, wire ties, other suitable fasteners, and the like may attach the present invention to virtually any surface. As best illustrated in FIGS. 8 and 11, these fasteners 12 may be located at the ends of a length of the spiral wrap LED lighting system 8' or utilized along any opening 4. Further, as best illustrated in FIG. 10, the present invention may also utilize standardized, quick connect conductors, wiring fasteners or wiring leads 9 commonly available for LED strip lighting to facilitate ease of installation and service.

According to another embodiment of the present invention, the spiral wrap lighting system and power system 8" can generally comprise at least one electromagnetic energy emitting device 106 capable of emitting electromagnetic waves within any of the ultraviolet, visible light, or infrared range of spectrums. Further, as best illustrated in FIG. 13, a spiral wrap light emitting device 108 may generally comprise a LED 6 and/or flexible LED strip 7 generally contained in a flexible protective coating 121, which may be configured in a functional lens shape.

As depicted in FIG. 31, the at least one electromagnetic energy emitting device 106 can generally be coupled with or in electrical communication with at least one flexible electrical conductor 107. In one embodiment, the electrical conductor 107 lacks the structure sufficient for being adapted to and maintained in a desired shape, such as a spiral, a coiled shape, or a generally helical shape. The electrical conductor 107 is coupled with, affixed upon, or otherwise attached to, a surface, or surfaces, of a flexible spiraling tubular-shaped sleeve, such as a spiral wrap tubing sleeve 1. The spiral wrap tubing sleeve 1 of the lighting system 8" can have a structure sufficient for being adapted to and maintained in a desired shape, such as a spiral, a coiled shape, or a generally helical shape, as best illustrated in FIG. 30. In combination, the spiral wrap tubing sleeve 1, the at least one electromagnetic energy emitting device 106, and the electrical conductor 107 may form a lighting system and power system 8" with structure sufficient for being adapted to and maintained in a desired flexible tubular cylindrical spiral sleeve shape.

In one embodiment where the spiral wrap lighting system and power system 8" configured as a desired flexible tubular cylindrical spiral sleeve shape, the at least one flexible electrical conductor 107 of the lighting system 8" may be coupled with or in electrical communication with at least one energy source, including, without limitation, an electrical storage device 126; one or more energy harvesting or capturing devices, such as photovoltaic cells 116; an arrangement of photovoltaic cells; and similar devices individually configured to comprise only electromagnetic energy emission, only energy harvesting, only energy storage, or only electrical communication. It will be appreciated that the at least one flexible electrical conductor 107 of the lighting system 8" may be coupled with or in electrical communication with any of the proceeding energy sources individually or in any combination thereof. As best illustrated in FIGS. 21, 25, 27, 28 and 31, the lighting system 8" may comprise at least one void 124, 125, such as a generally cylindrical void or other shaped void, defined within a first interior thickness 105. The at least one void 124, 125 may be adapted for receiving at least one component, such as electrical storage device 126 or an electrical control component 127 or an at least one electromagnetic energy emitting device 106, or other suitable component. Further, as best illustrated in FIG. 21, the lighting system 8" may comprise an access panel in communication with the at least one void 124, 125 for accessing the at least one component contained therein or for otherwise servicing the lighting system 8". It will be appreciated that the void 124, 125 defined in the first interior thickness 105, or any other portion of a second interior thickness 109, may comprise any suitable shape and be adapted for receiving any suitable component or combination of components or media, whether presently known or later developed.

Figure 27:
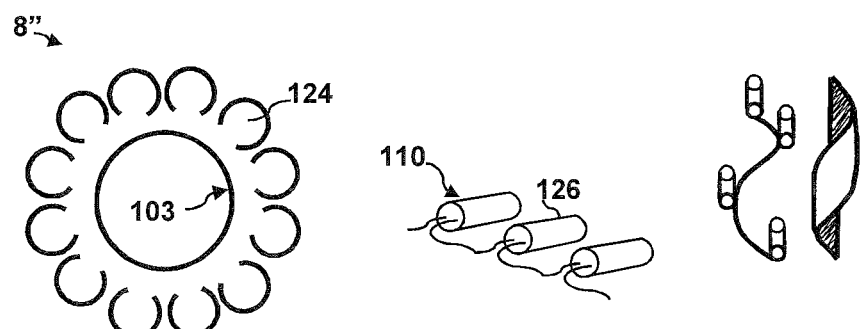
FIG. 27 is a schematic representation the power and lighting system in accordance with one embodiment of the present invention.

In one embodiment, the energy source may comprise an electrical storage device 126. The electrical storage device 126 may comprise at least one battery component, such as a generally cylindrical lithium-ion battery; however, it will be appreciated that the electrical storage device 126 may comprise any number or combination of components or media, whether presently known or later developed, adapted for electrical storage suitable for the needs and purposes of the present invention. The components of the electrical storage device 126 can be arranged in series 110, as best illustrated in FIG. 24, or in parallel. Further, it will be appreciated that the electrical storage device 126 can be arranged in such a manner to maintain a desired flexible cylindrical axially spiral shape, as best illustrated in FIGS. 27, 28, and 30.

In another embodiment, the energy source may comprise at least one energy harvesting or capturing source, such as a photovoltaic cell 116 or a photovoltaic panel configuration 111, 112. The energy harvesting or capturing device may be in electrical communication with the electromagnetic energy emitting device. The photovoltaic cell 116 or arrangement of photovoltaic cells of the lighting system 8", such as a photovoltaic panel configuration 111, 112, may be affixed upon, or otherwise attached to a surface 115, or surfaces, of a flexible spiraling tubular-shaped sleeve, such as a spiral wrap tubing sleeve 1, as best illustrated in FIGS. 19-21 and 26. The photovoltaic cell 116 or photovoltaic panel configuration 111, 112 may be arranged in a manner to optimize exposure to sunlight or light and conserve circumferential space around or about the lighting system 8". Such arrangements can include, without limitation, a "V" shape or accordion-shaped combination. For example, as depicted in FIG. 14, a plurality of surfaces 115 of the lighting system 8" can be arranged to create a series of peaks and valleys that correspond with the V-shaped combination of the at least one photovoltaic cell 116. In another embodiment, the arrangement of the photovoltaic cell 116 or photovoltaic panel configuration 111, 112 generally defines a flat plane. It will be appreciated that FIGS. 14 and 21 depict a quarter section of one embodiment of the present invention that is defined by representative section or boundary lines 122, which do not form part of the present invention. The V-shaped arrangement of the photovoltaic cell 116 or the photovoltaic panel configuration 111, 112 can be further arranged in several ways. As best illustrated in FIGS. 25, 26, and 28, the combination of the V-shaped arrangements of the photovoltaic cell 116 or the photovoltaic panel configuration 111, 112 can be arranged in a generally cylindrical axially spiraling circular fashion, wherein the circular arrangement of the V-shaped combination generally defines the first interior thickness 105 between the bottom valley 130 of each V-shaped combination. Further, the crest or apex 131 of each V-shaped combination of the at least one photovoltaic cell 116 generally defines a second interior thickness 109 with respect to the interior diameter 103, as depicted in FIG. 25. It will be appreciated that the cross-sectional profile of each of the plurality of surfaces 115 can vary. For example, as best illustrated in FIG. 14, the cross-sectional profile of each of the plurality of surfaces 115 can be generally linear. On the other hand, as best illustrated in FIG. 16, the cross-sectional profile of each of the plurality of surfaces 115 can be generally curvilinear. Further, the shape defined by adjacent plurality of surfaces 115 can vary widely, as also depicted in FIGS. 14 and 16.

Figure 28:
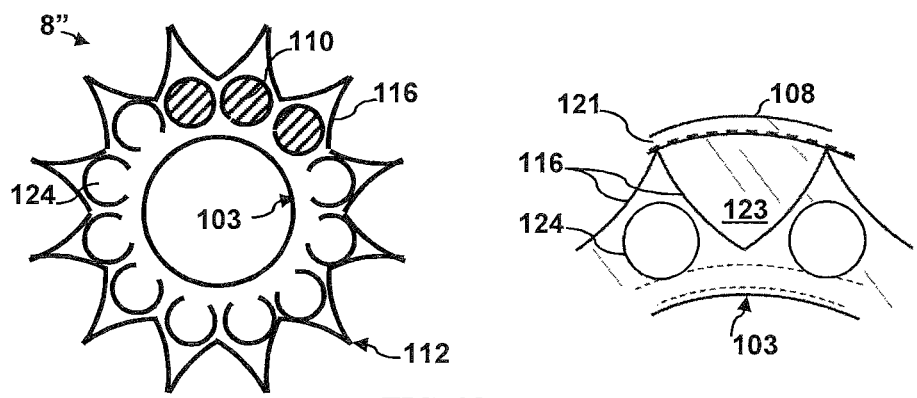
FIG. 28 is a schematic representation the phot power ovoltaic and lighting system in accordance with one embodiment of the present invention.

Further yet, as best illustrated in FIGS. 21 and 28, the V-shaped combination of the photovoltaic cell 116 may, together with an optional flexible protective coating 121, define a light gathering region 123 between the at least one photovoltaic cell 116 and the outermost point of the second interior thickness 109. The light gathering region 123 being suitable and advantageous for purposes of harvesting light as it refracts, reflects, or is otherwise collected within the two-sided triangular configuration of the V-shaped combination of the at least one photovoltaic cell 116, wherein the flexible protective coating 121 can define either a thin protective film or a substantially thick protective film adjacent to the two-sided triangular configuration. The flexible protective coating 121 can form a surface shape that encloses or completes the triangular cross-sectional profile of the V-shaped combination of the at least one photovoltaic cell 116, as best illustrated in FIG. 28. Such enclosing of the V-shaped combination of the at least one photovoltaic cell 116 by the flexible protective coating 121 can serve to further collimate or refract light received by photovoltaic cells 116, arrays, or panels.

Further, it will be appreciated that the bottom edge or edges of the accordion-style folds formed from the generally linear arrangement or the circular base formed from the generally circular arrangement are capable of supporting the photovoltaic cell 116 or the photovoltaic panel configuration 111, 112, or, more generally, the lighting system 8", in a generally perpendicular orientation relative to a horizontal surface. Further yet, as best illustrated in FIGS. 30 and 35, in another embodiment, the lighting system 8" may comprise a support point 132, wherein the support point 132 is adapted for supporting the lighting system 8" in a generally vertical orientation, including in a generally perpendicular orientation relative to a horizontal surface, or a generally horizontal orientation on its own accord.

The lighting system 8", as best illustrated in FIGS. 17 and 18, may comprise one or more revolutions, wherein an exterior surface of the lighting system 8" is defined by an upper edge 113 and a lower edge 114 along the length of the at least one revolution, wherein the exterior surface may comprise a flexible protective coating 121. In combination with a linear projection of the interior diameter 103, a line defined between the upper edge 113 and the lower edge 114 can generally define distance 117, represented by a dashed line. The at least one revolution can generally define an axis, which, depending on the orientation of the light system 8", can define either a vertical axis 118 or a horizontal axis 119, as best illustrated in FIGS. 30 and 35. Further, as best illustrated in FIGS. 29 and 34, axis 118 and axis 119 can define orthogonal plane. As best illustrated in FIGS. 30 and 35, the exterior surface can have a direction of orientation 120 generally proportional to an angle θ, which corresponds with the distance 117 and is relative to the vertical axis 118 or the horizontal axis 119. In another embodiment, the angle θ can be an angle or combinations of angles defined between interior diameter 103, which is parallel with either axis 118 or axis 119 and generally coplanar with the orthogonal planes defined by axis 118 and axis 119, and a line defined by upper edge 113 and lower edge 114, wherein corresponding distance 117 defined thereby generally comprises a resulting surface 133. In one embodiment, the angle θ can be between 5 degrees and 85 degrees. In another embodiment, the angle θ can be between 15 degrees and 60 degrees. In a preferred embodiment, the angle θ can be approximately 30 degrees. Further, the at least one revolution can generally define a first exterior circumference and a second exterior circumference, wherein the first exterior circumference can define a first exterior diameter 101, and the second circumference can define a second exterior diameter 102. Although FIG. 18 depicts the first exterior diameter 101 and the second exterior diameter 102 as not being equal, it will be understood that the first exterior diameter 101 and the second exterior diameter 102 can be generally equal. It will also be understood that the exterior diameter 101 and the second exterior diameter 102 may not be equal, such that the lighting system 8" generally defines a tapered or conical shape. Further, as depicted in FIGS. 17 and 18, the at least one revolution of the lighting system 8" may define a spiral length opening 104 between each complete revolution of the lighting system 8", wherein such spiral length opening 104 is generally proportionate to an interior diameter 103 defined by the at least one revolution of the lighting system 8". The spiral length opening 104 being suitable to aid in the process of wrapping the attachment onto a proportionately similar object, wherein the object enters or exits entering or exiting an interior diameter 103 of the spiral wrap lighting system and power system.

In another embodiment of the present invention, the lighting system 8" may comprise an illumination lens, wherein the surface 133 may be configured to be in operable relationship with material 121, as illustrated in FIGS. 31-33, and 35, to define the illumination lens. The surface 133 being suitable for dispersion or collimation of the emissions of the at least one electromagnetic energy emitting device 106. As best illustrated in FIGS. 31 and 32, the surface 133 may also provide a subsequent focal length for the emission of the at least one electromagnetic energy emitting device 106 through the material 121. Further, the material 121 may further comprise voids for various material and fluids, such as gas, which may be introduced to affect the speed of electromagnetic energy passing therethrough.

According to one embodiment, an electrical control component 127 may be coupled with or in electrical communication with the at least one electrical conductor 107, wherein the electrical control component 127 is configured to and is capable of controlling the emission of the at least one electromagnetic energy emitting device 106. For example, as depicted in FIG. 9, the lighting system 8" may emit emissions over its entire perimeter or circumference under the control of the electrical control component 127. However, it will be appreciated that the electrical control component 127 can restrict the emissions of the lighting system 8" to a less-than-whole portion of the perimeter or circumference of the lighting system 8", such as at least one quarter section of the perimeter or circumference of the lighting system 8". Further, the electrical control component 127 can restrict the emissions of the lighting system 8" to a half section of the perimeter or circumference of the lighting system 8". The electrical control component 127 may comprise an electrical control circuit board, an electrical relay, or an electrical switch. Further, by way of example, the electrical control component 127 may comprise a battery management system ("BMS") circuit board, a maximum power point tracking ("MPPT") charge controller, switches and dimmers, and the like. However, it will be appreciated that the electrical control component 127 may comprise any number or combination of components or media, whether presently known or later developed, adapted for controlling the emission of the present invention.

In one embodiment, the lighting system 8" may comprise an electrically conductive port. The electrically conductive port can be designed and adapted for charging at least one electrical storage device 126, such as a battery internal or external to the lighting system 8", including via the electrical conductor 107. Further, the electrically conductive port can be designed and adapted for powering, energizing or charging at least one separate electrically powered device or component that is either internal or external to the lighting system 8". Such electrically conductive port being known in the electrical component industry or hereafter developed.

According to one embodiment, the lighting system 8" may comprise an unpowered illumination region 128 as depicted in FIG. 33. The unpowered illumination region 128 being capable of emitting various emissions without energy or power for an at least set portion of time. The unpowered illumination region 128 may generally comprise phosphorescent polyethylene microspheres or other unpowered illuminators, whether presently known or hereafter developed. Further, the unpowered illumination region 128 may function as a diffuser for emissions from an at least one electromagnetic energy emitting device 106 or light from an LED 6 or LED strip 7 and may be utilized in any region of said spiral wrap power and lighting device.

As discussed above, the lighting system 8" may include structural elements or components, such as wires, stiffening members, metallic strips, molded urethane comprising a durometer of one or more combinations, or other materials, that further permit the lighting system 8" to be flexible and maintain a desired shape, which, as mentioned above, may include materials that are in addition to or in alternative to materials such as plastics, rubbers, textiles, cellulosic materials, polymers, and the like, and any combination thereof. These elements may be located, for example, within the inner core of a spiral wrap tubing sleeve 1 (i.e., integrated at least partially or wholly within the material forming the spiral wrap tubing sleeve 1) or may be located within the interior 3 and/or the exterior 2 of the spiral wrap tubing sleeve 1.

The lighting system 8 of the present invention can be adapted for resolving numerous lighting issues, such as the constraints of traditional lighting hardware. For example, within a light fixture, the area consumed by a lamp socket is not illuminated, causing a dark area within a lighting fixture. The present invention resolves this by spanning, with illumination not just the area for placement of a traditional bulb, but over the entirety of a desired distance. Another issue is simply how to physically place, and then service, a traditional bulb within a lamp 10. For example, when it's desired for a lamp base to be illuminated, placing a traditional bulb and associated hardware within a lamp base is bulky and difficult both for installation and service. The present invention resolves this through embodiments which are small yet capable of spanning any desired portion of an interior space of a lamp 10, as best illustrated in FIG. 11.

The lighting system 8 of the present invention also resolves lighting issues relating to usage of LED lighting strips as an alternative within a lamp base. As previously described, LED rope lights have no capacity to maintain a particular shape nor do they offer enough concentrated light output within a specified shape to meet some lighting demands. Furthermore, both LED ropes and strips alone, lack sufficient physical structure. Some solutions have been to affix LED strips upon square or round tubing, but this requires the tubing to become physically mounted within the lamp assembly, thus necessitating lamp disassembly to change the LED Strips. The present invention resolves these issues, by means of the coiling or spiral shape, by simply wrapping around, as relevant, traditional lamp rod 11 materials within a lamp 10, as best illustrated in FIG. 11.

The lighting system 8 of the present invention also provides an improvement over other known lighting systems. Specifically, the lighting system 8 has advantageous size, light output or lumens, color spectrum of light, low energy consumption, low heat output, ability to be variably dimmed, very long life, and versatile application by means of a flexible spiral wrap shape being configurable upon or around innumerable objects. At the same time, the lighting system 8 also has a sufficient structural element so as to maintain a desired shape and general configuration of a flexible spiral cylindrical shape. The spiral wrap lighting system and power system 8", in addition to being configurable around innumerable objects, such as metallic tubing, rope, wire, or the like, may also provide a compact, integrated power system having energy harvest and or energy storage capacities within a flexible spiral cylindrical shape.

It will be appreciated that the lighting system and power system 8", which is capable of maintaining a flexible axially spiraling shape on its own accord, may comprise at least one of an electromagnetic energy emission device, an energy harvest device, an energy storage device 126, and an electrical control device, wherein each may be separated as an individual device configuration or as an integrated combination device system or any combination thereof.

It is to be understood that the present invention is not limited by the herein described configurations of either the spiral wrap tubing sleeve 1, LED strip lighting, the at least one electromagnetic energy emitting device 106, photovoltaic cell(s) 116, or the combinations shown thereof, nor by the choice of spiral surface—be it the interior or exterior or both of the spiral tubular shape, or of a particular dimension or torsion spiral pitch. Rather, the embodiments described herein are simply illustrative, as there are many possible configurations, materials, and processes which may be derived from the present invention. The present invention may be suitable for use with other types of lighting sources or illuminating elements.

From the accompanying materials, it will be seen that the invention is one well adapted to attain all the ends and objects set forth herein with other advantages which are obvious and which are inherent to the structure. It will be understood that certain features and subcombinations are of utility and may be employed without reference to other features and subcombinations. This is contemplated by and is within the scope of the claims. Since many possible embodiments of the invention may be made without departing from the scope thereof, it is also to be understood that all matters herein set forth or shown in the accompanying drawings are to be interpreted as illustrative and not limiting.

The constructions described in the accompanying materials and illustrated in the drawings are presented by way of example only and are not intended to limit the concepts and principles of the present invention. Thus, there has been shown and described several embodiments of a novel invention. As is evident from the description, certain aspects of the present invention are not limited by the particular details of the examples illustrated herein, and it is therefore contemplated that other modifications and applications, or equivalents thereof, will occur to those skilled in the art. The terms "having" and "including" and similar terms as used in the foregoing specification are used in the sense of "optional" or "may include" and not as "required." Many changes, modifications, variations and other uses and applications of the present construction will, however, become apparent to those skilled in the art after considering the specification and the accompanying drawings. All such changes, modifications, variations and other uses and applications which do not depart from the spirit and scope of the invention are deemed to be covered by the invention which is limited only by the claims which follow.

What is claimed:

1. A flexible photovoltaic system comprising:
    a flexible tubular sleeve formed from a coiled strip of material, the sleeve having a structure sufficient for being adapted to and maintained in a desired shape;
    at least one photovoltaic cell attached to the sleeve; and
    at least one electrical conductor coupled to the at least one photovoltaic cell and being adapted for connection with at least one of an electrically conductive port, a light emitting device, an electrical storage device, an electrical control device, and an electrically powered device;
    wherein the photovoltaic system has structure sufficient for being maintained in a desired flexible tubular shape on its own accord.

2. The photovoltaic system of claim 1 comprising a plurality of photovoltaic cells arranged in a photovoltaic panel configuration.

3. The photovoltaic system of claim 1 comprising a plurality of photovoltaic cells arranged in a generally circular configuration.

4. The photovoltaic system of claim 1 comprising a plurality of photovoltaic cells arranged in a generally helical configuration.

5. The photovoltaic system of claim 4, wherein the photovoltaic cells define at least one revolution.

6. The photovoltaic system of claim 1 comprising at least two photovoltaic cells, wherein the at least two photovoltaic cells are arranged in a V-shaped configuration.

7. The photovoltaic system of claim 1, wherein the electrically conductive port is adapted for connection with at least one of the light emitting device, the electrical storage device, and the electrically powered device.

8. The photovoltaic system of claim 1, wherein the light emitting device includes a plurality of axially and spirally spaced lighting sources affixed to a flexible strip.

9. The photovoltaic system of claim 8, wherein the flexible strip lacks structure sufficient for being adapted to and maintained in a desired shape.

10. The photovoltaic system of claim 9, wherein the flexible strip is affixed to the sleeve.

11. The photovoltaic system of claim 1, wherein the light emitting device emits visible light.

12. The photovoltaic system of claim 1, wherein the sleeve is constructed of a spiral cut tube.

13. The photovoltaic system of claim 1, wherein the sleeve is capable of being wrapped around an object.

14. The photovoltaic system of claim 1, wherein the sleeve is capable of being coiled around an object.

15. The photovoltaic system of claim 1, wherein the electrical storage device is a battery and is coupled with the sleeve.

16. A flexible power system comprising:
    a flexible tubular sleeve formed from a coiled strip of material, the sleeve having a structure sufficient for being adapted to and maintained in a desired shape;
    a plurality of batteries attached to the sleeve and arranged in a generally helical configuration; and
    at least one electrical conductor coupled to the plurality of batteries and being adapted for connection with at least one of an electrically conductive port, a light emitting device, a photovoltaic cell, an electrical control device, and an electrically powered device;
    wherein the power system has structure sufficient for being maintained in a desired flexible tubular shape on its own accord.

17. A flexible photovoltaic and power system comprising:
    a flexible tubular sleeve formed from a coiled strip of material, the sleeve having a structure sufficient for being adapted to and maintained in a desired shape;
    an opening between an interior and an exterior of said sleeve rotating around its circumference and being defined between two adjacent revolutions of said coiled strip of material, wherein said opening permits wrapping whereby an object may enter or exit an interior of the sleeve;
    at least one photovoltaic cell attached to the sleeve; and
    at least one electrical storage device in electrical connection with the at least one photovoltaic cell;
    wherein the photovoltaic and power system has structure sufficient for being maintained in a desired flexible tubular spiral sleeve shape on its own accord.

* * * * *